(12) United States Patent
Zaidi

(10) Patent No.: US 7,718,467 B2
(45) Date of Patent: May 18, 2010

(54) MEMORY DEVICE

(75) Inventor: Shoaib Hasan Zaidi, Poughkeepsie, NY (US)

(73) Assignee: Qimonda AG, Munich (DE)

( * ) Notice: Subject to any disclaimer, the term of this patent is extended or adjusted under 35 U.S.C. 154(b) by 117 days.

(21) Appl. No.: 12/049,484

(22) Filed: Mar. 17, 2008

(65) Prior Publication Data

US 2008/0157072 A1    Jul. 3, 2008

Related U.S. Application Data

(63) Continuation of application No. 11/120,007, filed on May 2, 2005, now Pat. No. 7,408,240.

(51) Int. Cl.
*H01L 29/08* (2006.01)
(52) U.S. Cl. .................. 438/102; 438/95; 257/E21.068
(58) Field of Classification Search .................. 257/42, 257/E29.029, E21.068; 438/102, 84, 95
See application file for complete search history.

(56) References Cited

U.S. PATENT DOCUMENTS

| | | | |
|---|---|---|---|
| 6,797,612 B2 * | 9/2004 | Zahorik | 438/639 |
| 2003/0075778 A1 | 4/2003 | Klersy | |
| 2009/0095953 A1 * | 4/2009 | Chen et al. | 257/4 |

* cited by examiner

*Primary Examiner*—Roy K Potter
(74) *Attorney, Agent, or Firm*—Dicke, Billig & Czaja, PLLC

(57) ABSTRACT

A phase change memory cell is disclosed. The phase change memory cell includes a first thin film spacer and a second thin film spacer. The first thin film spacer defines a sub-lithographic dimension and is electrically coupled to a first electrode. The second thin film spacer defines a sub-lithographic dimension and is electrically coupled between a second electrode and the first thin film spacer. In this regard, the phase change memory cell is formed at a boundary where the first thin film spacer electrically contacts the second thin film spacer.

18 Claims, 13 Drawing Sheets

MEMORY DEVICE

CROSS REFERENCE TO RELATED APPLICATIONS

This is a Continuation of co-pending U.S. patent application Ser. No. 11/120,007, filed on May 2, 2005, assigned to the assignee of the present invention and incorporated herein by reference.

BACKGROUND

Semiconductor chips provide memory storage for electronic devices and have become very popular in the electronic products industry. In general, many semiconductor chips are typically formed (or built) on a silicon wafer. The semiconductor chips are individually separated from the wafer for subsequent use as memory in electronic devices. In this regard, the semiconductor chips define memory cells that are configured to store retrievable data, often characterized by the logic values of 0 and 1.

Phase change memory cells are one type of memory cell capable of storing retrievable data between two or more separate states (or phases). The phase change memory cells have a structure that can generally be switched between states. For example, the atomic structure of one type of phase change memory cells can be switched between an amorphous state and one or more crystalline states. In this regard, the atomic structure can be switched between a general amorphous state and multiple crystalline states, or the atomic structure can be switched between a general amorphous state and a uniform crystalline state. In general terms, the amorphous state can be characterized as having more electrical resistivity than the crystalline state(s), and typically includes a disordered atomic structure. In contrast, the crystalline state(s) generally has a highly ordered atomic structure and is associated with having a higher electrical conductivity than the amorphous state.

Materials that exhibit this phase change memory characteristic include the elements of Group VI of the periodic table (and their alloys), such as Tellurium and Selenium, referred to as chalcogenides or chalcogenic materials. Other non-chalcogenide materials also exhibit phase change memory characteristics. One characteristic of chalcogenides is that the electrical resistivity varies between the amorphous state and the crystalline state(s), and this characteristic can be beneficially employed in two level or multiple level systems where the resistivity is either a function of the bulk material or a function of the partial material. As a point of reference, it is relatively easy to change a chalcogenide between the amorphous state (exhibiting a disordered structure, for example, like a frozen liquid) and the crystalline state(s) (exhibiting a regular atomic structure). In this manner, manipulating the states of the chalcogenide permits a selective control over the electrical properties of the chalcogenide, which is useful in the storage and retrieval of data from the memory cell containing the chalcogenide.

The atomic structure of the chalcogenide can be selectively changed by the application of energy. With regard to chalcogenides in general, at below temperatures of approximately 150 degrees Celsius both the amorphous and crystalline states are stable. A nucleation of crystals within the chalcogenide can be initiated when temperatures are increased to the crystallization temperature for the particular chalcogenide (approximately 200 degrees Celsius). In particular, the atomic structure of a chalcogenide becomes highly ordered when maintained at the crystallization temperature, such that a subsequent slow cooling of the material results in a stable orientation of the atomic structure in the highly ordered (crystalline) state. To achieve the amorphous state in the chalcogenide material, the local temperature is generally raised above the melting temperature (approximately 600° C.) to achieve a highly random atomic structure, and then rapidly cooled to "lock" the atomic structure in the amorphous state.

In one known structure of a phase change memory cell, the memory cell is formed at the intersection of a phase change memory material (chalcogenide) and a resistive electrode. Passing an electrical current of an appropriate value through the resistive electrode heats the phase change memory cell, thus affecting a phase change in its atomic structure by the principals described above. In this manner, the phase change memory cell can be selectively switched between logic states 0 and 1, and/or selectively switched between multiple logic states.

With the above background in mind, the known lithographic techniques for forming phase change memory cells can be improved upon. In particular, the known lithographic techniques for forming phase change memory cells result in large contact areas between the resistive electrode and the phase change memory material such that temperature induced changes between logic states is not optimum.

SUMMARY

One embodiment of the present invention provides a phase change memory cell. The phase change memory cell comprises a first thin film spacer and a second thin film spacer. The first thin film spacer defines a sub-lithographic dimension and is electrically coupled to a first electrode. The second thin film spacer defines a sub-lithographic dimension and is electrically coupled between a second electrode and the first thin film spacer. In this regard, the phase change memory cell is formed at a boundary where the first thin film spacer electrically contacts the second thin film spacer.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
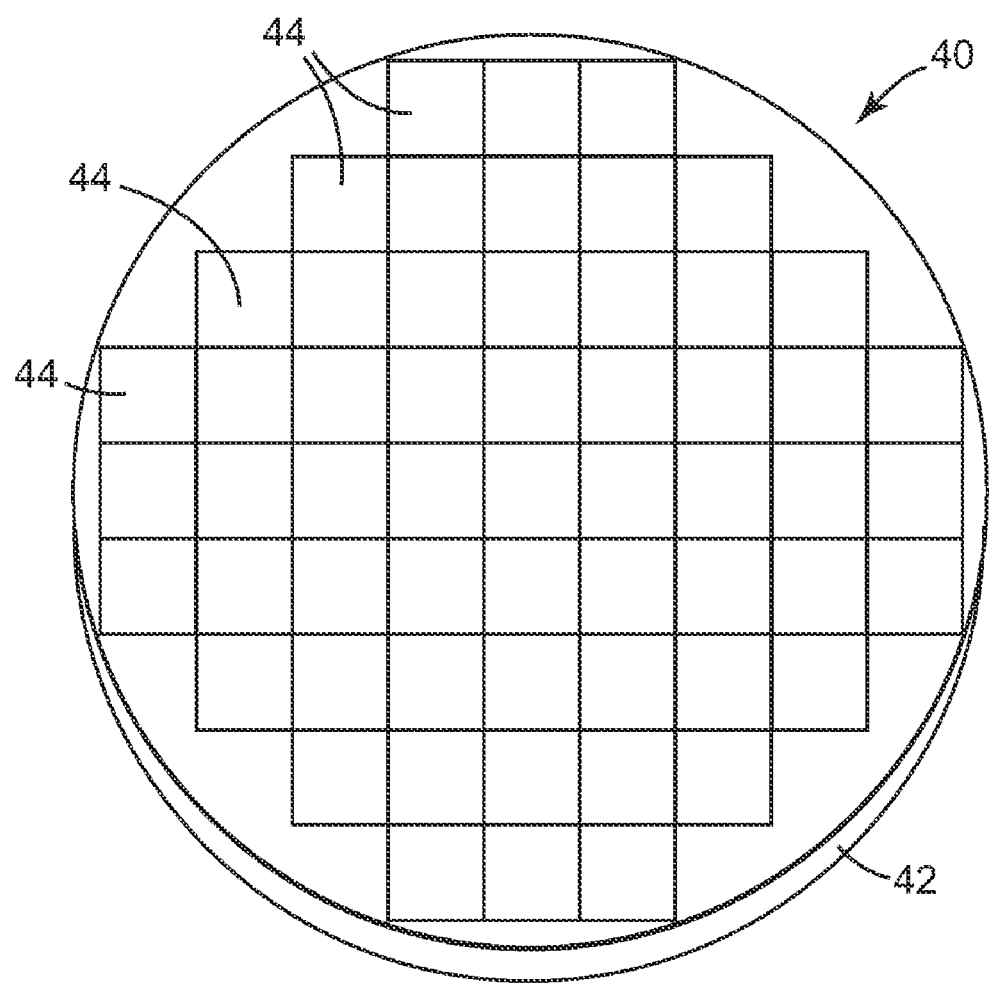
FIG. 1 illustrates a perspective view of one embodiment of a memory wafer including a plurality of memory chips.

FIG. 1 is a perspective view of a simplified memory wafer 40 according to one embodiment of the present invention. The memory wafer 40 includes a silicon wafer 42 having a plurality of separable memory chips 44 disposed thereon. Each of the separable memory chips 44 include an array of memory cells formed as described below.

Figure 2:
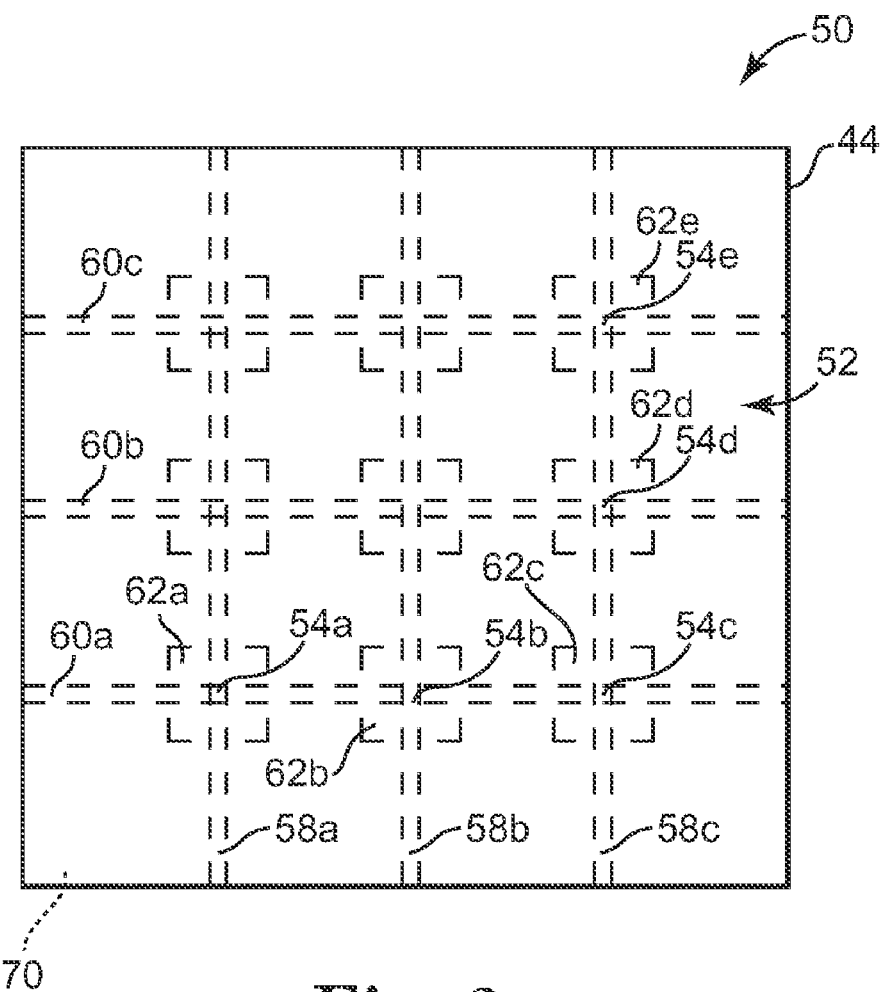
FIG. 2 illustrates a top view of one embodiment of a memory device illustrating an array of phase change memory cells disposed on a chip separated from the memory wafer.

FIG. 2 is a top view of a memory device 50 including an array 52 of phase change memory cells 54a-54e disposed on a chip 44 separated from the memory wafer 40. Array 52 of phase change memory cells 54 is defined by a plurality of first spacers 58a, 58b, 58c deposited to extend in a first direction across array 52, and a plurality of second spacers 60a, 60b, 60c deposited to extend in a second direction across array 52 non-parallel to the first direction. In this regard, each of first spacers 58a, 58b, 58c and second spacers 60a, 60b, 60c define at least one sub-lithographic dimension such that second spacers 60a, 60b, 60c electrically contact the first spacers 58a, 58b, and 58c across a sub-lithographically small contact area. A phase change memory cell, for example phase change memory cell 54a, is formed at each intersection at each of the first spacers 58a, 58b, 58c, with each of the second non-parallel spacers 60a, 60b, 60c (and specifically, in this instance, first spacer 58a and second spacer 60a). As described below, in one embodiment an etch process is employed to separate the intersecting plurality of first spacers 58a, 58b, 58c and second spacers 60a, 60b, 60c into an array of mutually related, but separate, memory cells.

In addition, FIG. 2 illustrates that memory device 50 defines a plurality of plugs 62a, 62b, 62c, 62d, 62e disposed within a dielectric field 70. As a point of reference, dielectric field 70 can be an oxide field, a nitride field, or other dielectric having suitable thermal etch and electrical characteristics. In one embodiment, the plugs 62a-62e are electrically conductive and form a first electrode for each of the respective phase change memory cells 54a-54e. In this regard, plugs 62a-62e define electrical contact, and can be formed of material including, but not limited to, tungsten, copper, or any other suitable plug material.

It is to be understood that chip 44 illustrates but a limited portion of array 52 and in this regard shows only a limited number of the phase change memory cells 54. In addition, one with skill in the art will recognize that spacers 60a, 60b, 60c can exhibit a range of electrical resistance properties depending upon factors such as material properties and physical structure. In this regard, in one embodiment first spacers 58a, 58b, 58c are "resistive," wherein the electrical resistance of first spacers 58a, 58b, 58c is, in general, greater than the electrical resistance of second spacers 60a, 60b, 60c. In another embodiment, first spacers 58a, 58b, 58c are "conductive" spacers.

As a point of reference, array 52 comprises rows and columns of memory cells 54. In this regard, memory cells 54a, 54b, 54c are defined to be in separate columns of array 52, and memory cells 54c, 54d, 54e are defined to be in separate rows of array 52. To this end, an exemplary embodiment of processing a plurality of first spacers 58a, 58b, 58c intersecting with a plurality of second non-parallel spacers 60a, 60b, 60c that enables large areas of memory device 50 to be "block exposure" processed in a contemporaneous manner to include an array 52 of phase change memory cells 54 having sub-lithographic dimensions is described below.

Figure 3:
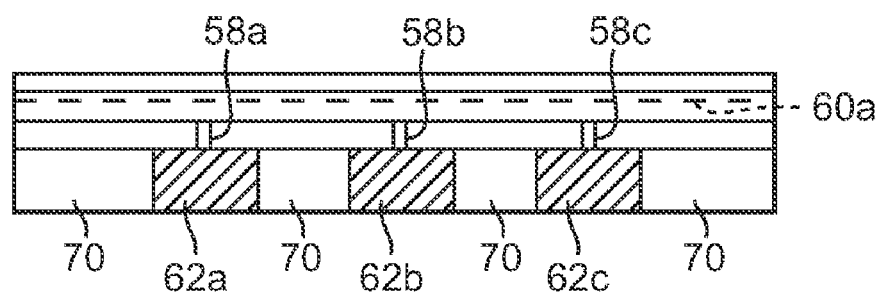
FIG. 3 illustrates a simplified cross-sectional view of one embodiment of the memory device illustrated in FIG. 2.

FIG. 3 is a cross-sectional view of a portion of memory device 50 illustrating columns of plugs 62a, 62b, 62c (i.e., conductive electrodes) disposed in dielectric field 70 and including columns of first spacers 58a, 58b, 58c, and one row of a second spacer 60a (illustrated by dotted line) in electrical contact with spacers 58a, 58b, and 58c, according to one embodiment of the present invention. An exemplary block exposure process to achieve the structure illustrated in FIG. 3 will be described with reference to the following figures.

Figure 4:
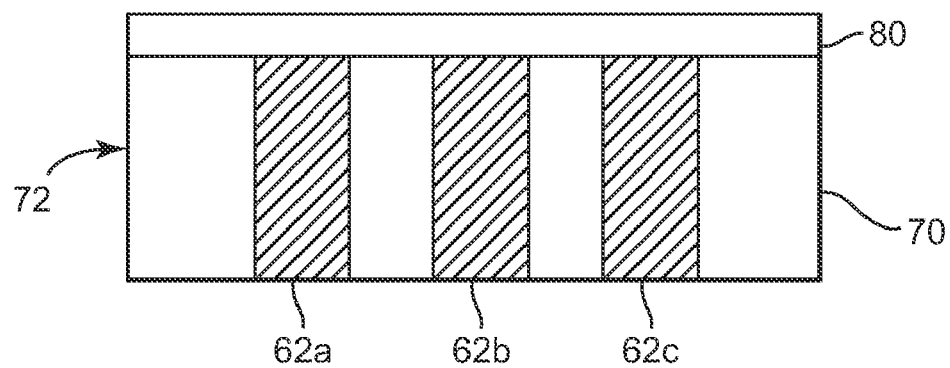
FIG. 4 illustrates a simplified cross-sectional view of one embodiment of a series of plugs disposed in a field of dielectric material.

FIG. 4 is a simplified cross-sectional view of a substrate 72 of wafer 42 including a silicon nitride layer 80 according to one embodiment of the present invention. Substrate 72 includes columns of plugs 62a, 62b, 62c disposed in dielectric field 70 in an initial stage of front end processing. As a point of reference, substrate 72 also includes lower wafer levels that are not shown for ease of illustration. Substrate 72 is built up with subsequent process steps in forming memory device 50 (FIG. 2). In this regard, a first process step includes depositing silicon nitride layer 80 across substrate 72.

Figure 5:
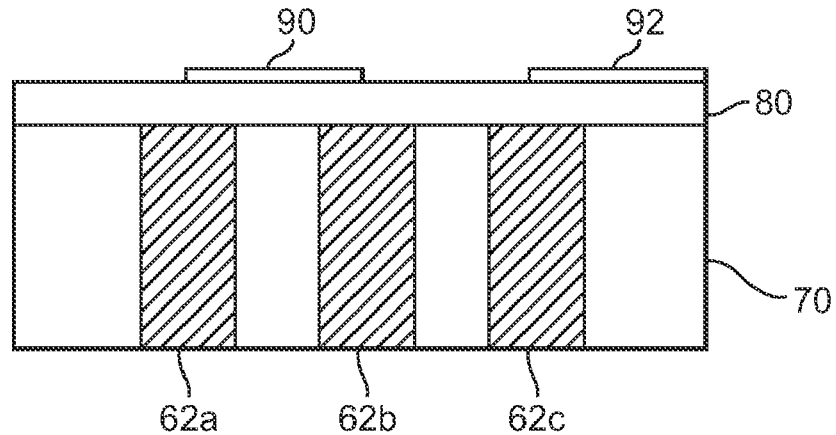
FIG. 5 illustrates a simplified cross-sectional view of one embodiment of a photoresist layer disposed on an insulating layer as illustrated in FIG. 4.

FIG. 5 illustrates a first photoresist layer 90 extending across adjacent plugs 62a, 62b and a second photoresist layer 92 centered on a column of plugs 62c according to one embodiment of the present invention. Photoresist layers 90, 92 extend along rows of array 52 (FIG. 2) and span adjoining plugs. Photoresist layers 90, 92 are patterned directly onto silicon nitride layer 80 via, for example, a photolithography step, and can include spin-coated photoresist materials as known to one of skill in the art.

Figure 6:
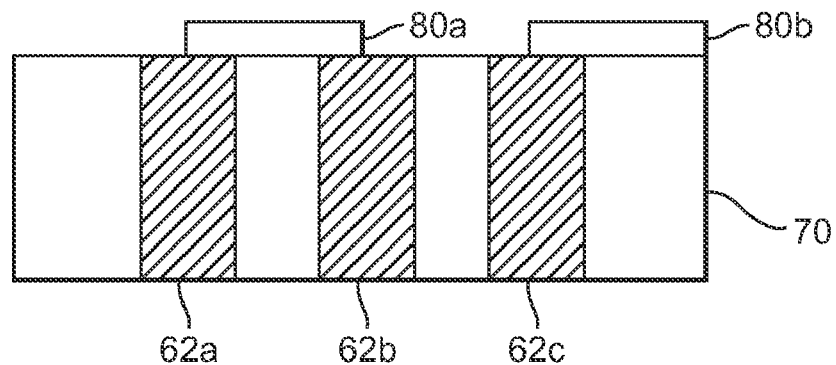
FIG. 6 illustrates a simplified cross-sectional view of one embodiment of a step having edges that lie on adjacent plugs.

FIG. 6 illustrates silicon nitride layer 80 (FIG. 5) after etching and stripping photoresist layers 90, 92 wherein silicon nitride layer 80 is partially removed to expose steps 80a, 80b of silicon nitride having edges lying on adjacent columns of plugs 62a, 62b, and 62c. Specifically, silicon nitride step 80a spans and is centered on tungsten plug 62a, 62b.

Figure 7:
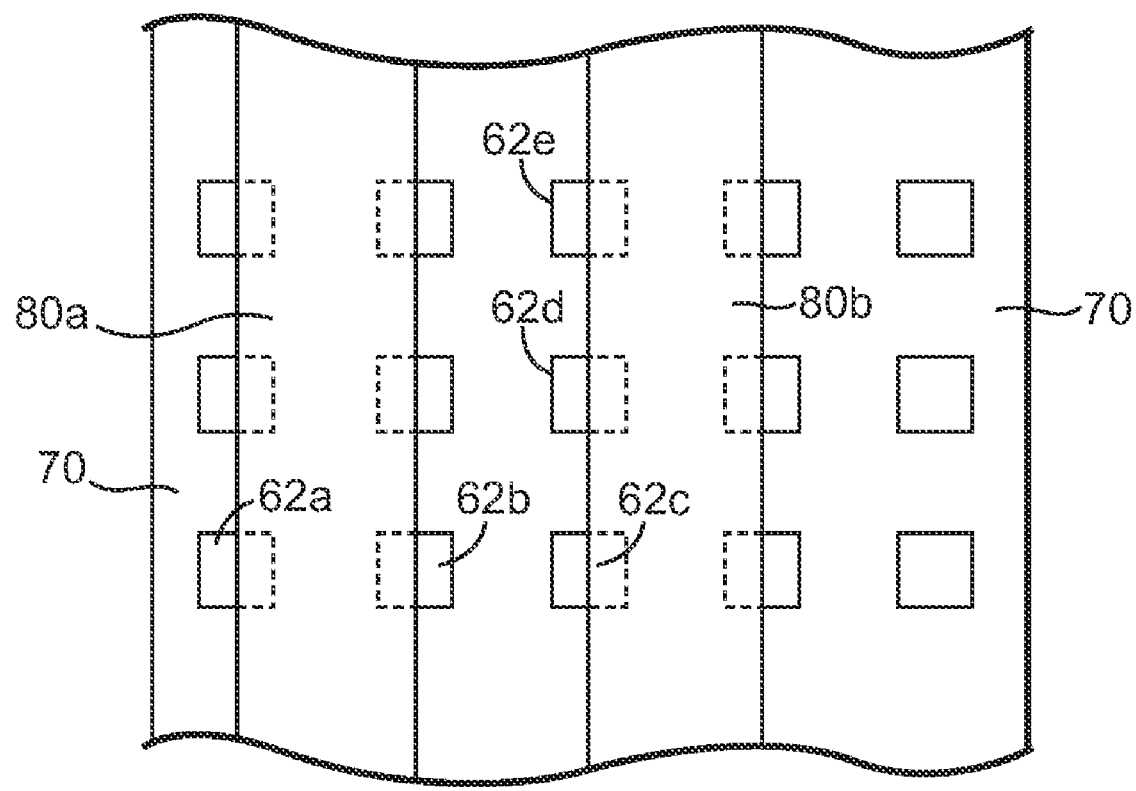
FIG. 7 illustrates a top view of steps disposed to lie on adjacent plugs as illustrated in FIG. 6.

FIG. 7 illustrates a top view of silicon nitride steps 80a, 80b disposed atop dielectric field 70 such that edges of steps 80a, 80b lie on adjacent plugs 62a, 62b, and 62c (and hence, edges of steps 80a, 80b are configured to lie on adjacent plugs). FIG. 7 illustrates a building block geometry that enables block exposure deposition of materials onto wafer 42 (FIG. 1) that permits large areas of rows and columns of memory cells to be processed at the same time, while also minimizing deleterious edge effects that can result in delays in temperature-induced changes between logic states.

Figure 8:
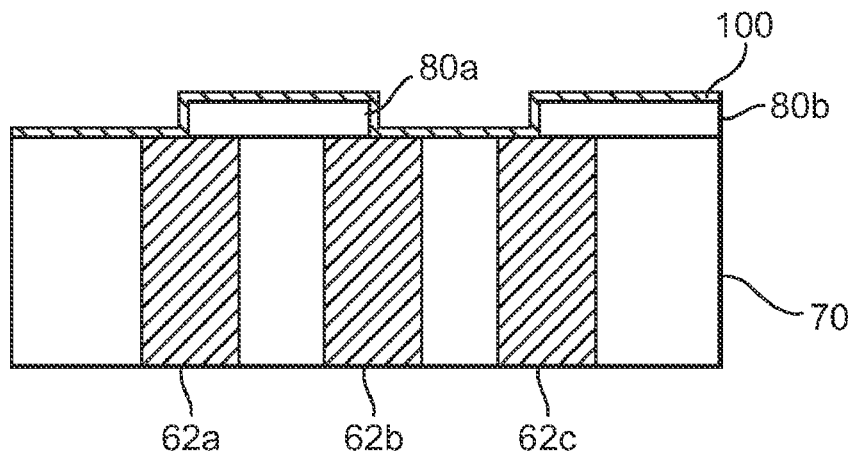
FIG. 8 illustrates a simplified cross-sectional view of one embodiment of a spacer material deposited over a top portion of the step illustrated in FIG. 6.

FIG. 8 illustrates a deposition of spacer material 100 extending across silicon nitride steps 80a, 80b according to one embodiment of the present invention. The spacer material 100 can be selected from a variety of materials in accordance with the present invention. Generally, chalcogenide alloys comprising one or more elements of Column IV-VI of the periodic table are useful as spacer material. In one embodiment, spacer material 100 is a chalcogenide alloy comprising GeSbTe (GST), for example $Ge_2Sb_2Te$, or AgInSbTe. In one embodiment, spacer material 100 is titanium nitride having a resistivity of between 30-70 ohm-cm and a melting point of 2950 degrees Celsius.

Spacer material 100 is preferably deposited to have a sub-lithographic thickness of less than approximately 50 nanometers, more preferably the spacer material 100 is deposited to have a thickness of less than approximately 30 nanometers, and most preferably spacer material 100 is deposited to have a sub-lithographic thickness of approximately 20 nanometers. Spacer material 100 can be deposited by chemical vapor deposition (CVD), atomic layer deposition (ALD), metal organic chemical vapor deposition (MOCVD), plasma vapor deposition (PVD), jet vapor deposition (JVD), or any other suitable deposition technique. In this manner, a block exposure deposition of spacer material 100 having sub-lithographic dimensions is formed over a large area of wafer 42 (FIG. 1).

Figure 9:
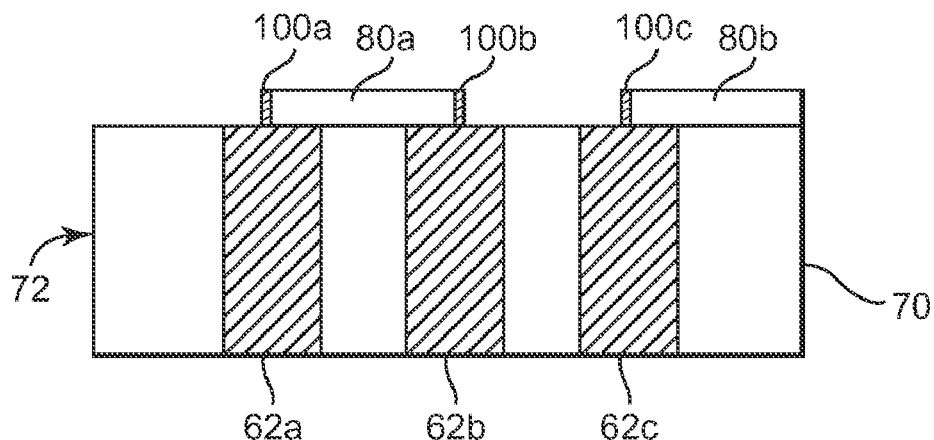
FIG. 9 illustrates a simplified cross-sectional view of one embodiment of spacers extending across a plurality of rows of plugs.

FIG. 9 illustrates spacers 100a, 100b, 100c disposed in columns and extending across rows of substrate 72 according to one embodiment of the present invention after a reactive ion etch. The reactive ion etch removes selective portions of spacer material 100 (FIG. 8) resulting in spacers 100a, 100b, 100c remaining attached to steps 80a, 80b, respectively. As a point of reference, spacers 100a, 100b, 100c after the reactive ion etch define sub-lithographic dimensions characterized by the thickness of the deposition layer, which in one embodiment is approximately 20 nanometers. In this regard, the reactive ion etch enables large areas of wafer 42 (FIG. 1) to be block exposure processed with columns of spacers, for example columns of spacers 100a, 100b, 100c that are insensitive to an angular orientation of adjacent steps 80a, 80b to which spacers 100a, 100b, 100c are adhered to. Thus, the reactive ion etch is a time-efficient and robust process for the bulk formation of spacers on substrate 72.

Figure 10:
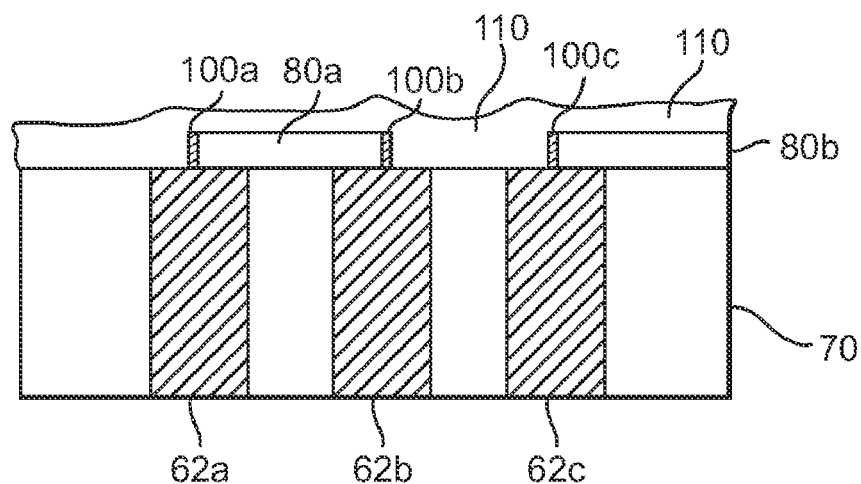
FIG. 10 illustrates a simplified cross-sectional view of one embodiment of a dielectric disposed over the spacers illustrated in FIG. 9.

FIG. 10 is a cross-sectional view illustrating a bulk silicon nitride deposition 110 extending over spacers 100a, 100b, and 100c according to one embodiment of the present invention. In one embodiment, the bulk deposition 110 is on the order of several hundred nanometers thick. As a point of reference, nitride deposition 110 can be a dielectric, in general, having suitable thermal etch and electrical characteristics.

Figure 11:
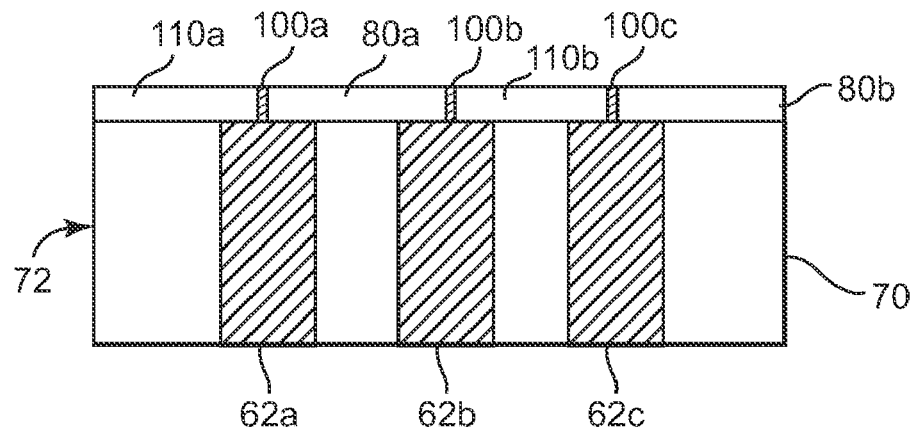
FIG. 11 illustrates a simplified cross-sectional view of one embodiment of the spacers illustrated in FIG. 9 after a planarization step.

FIG. 11 illustrates silicon nitride deposition 110 (FIG. 10) after a chemical mechanical polishing (CMP) processing step (i.e., a planarization step) according to one embodiment of the present invention. Silicon nitride deposition 110 has been removed such that spacers 100a, 100b, 100c are sandwiched between silicon nitride. In particular, spacer 100a is sandwiched between step 80a, and step 110a, and spacer 100b is sandwiched between step 80a and step 110b. Consequently, spacers 100a, 100b, 100c extend in separate columns across rows of substrate 72 and are in electrical contact with conductive electrode plugs 62a, 62b, 62c, respectively.

Figure 12:
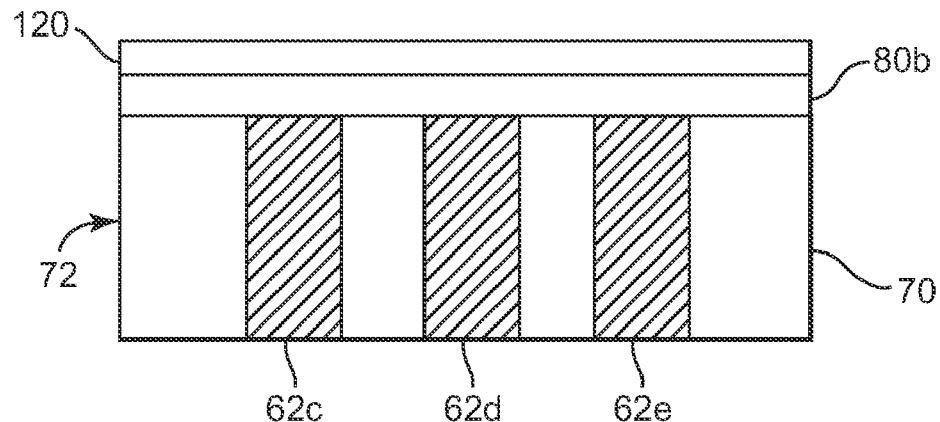
FIG. 12 illustrates a simplified cross-sectional view of one embodiment of an array of plugs.

FIG. 12 illustrates substrate 72 rotated by 90 degrees such that a view along rows of plugs 62c, 62d, 62e is provided (see FIG. 2). In particular, step 80b is illustrated extending across substrate 72 such that spacers 100a, 100b, 100c are not visible in the view of FIG. 12. In addition, FIG. 12 illustrates a dielectric layer 120, for example an oxide layer 120, disposed over spacers 100a, 100b, 100c and steps 80a, 80b, 110a, and 110b illustrated in FIG. 10. To this end, when viewed down rows 62c, 62d, and 62e, oxide layer 120 is in contact with step 80b. As a point of reference, dielectric layer 120 can be any suitable layer of dielectric material, and is referred to hereafter for purposes of descriptive clarity as an oxide layer 120.

Figure 13:
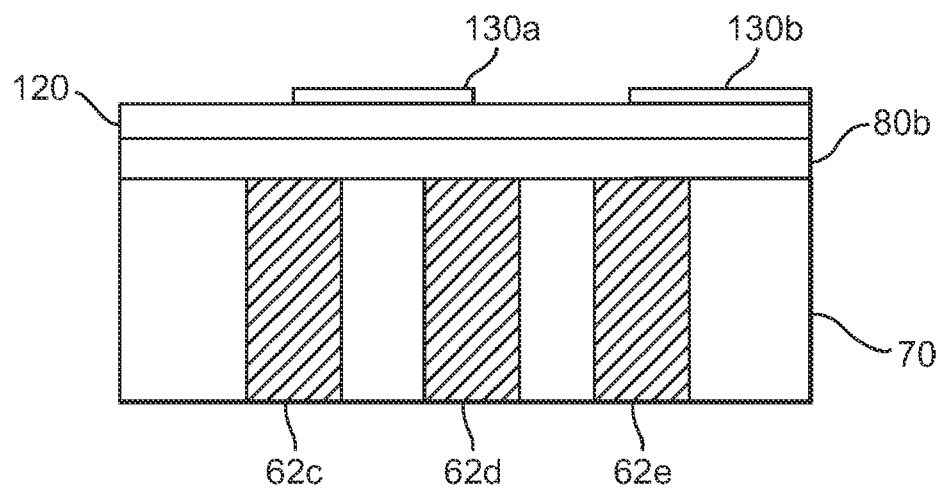
FIG. 13 illustrates a simplified cross-sectional view of one embodiment of a photoresist layer disposed upon adjacent rows of plugs within the array as illustrated in FIG. 12.

FIG. 13 illustrates a patterned photoresist layer according to one embodiment of the present invention. Photoresist layers 130a, 130b are patterned directly onto oxide layer 120 via, for example, a photolithography step, and can include spin-coated photoresist materials as known to one of skill in the art. A first photoresist layer 130a is patterned to extend over adjacent rows of plugs 62c, 62d. A second photoresist layer 130b is patterned over and centered on a row of plugs 62e.

Figure 14:
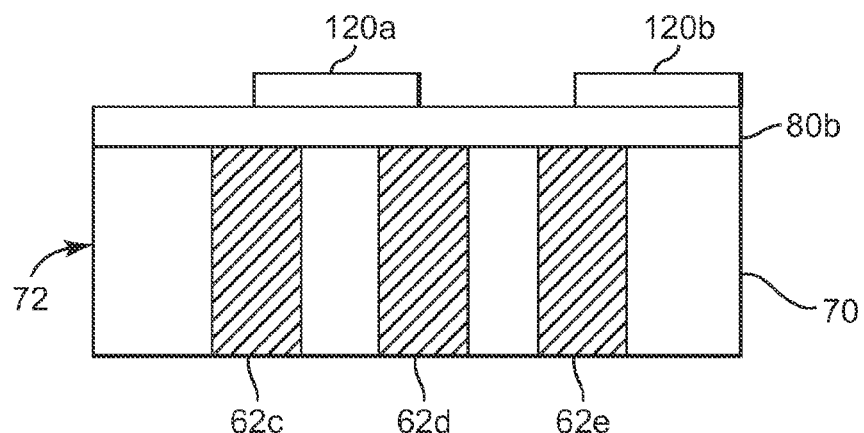
FIG. 14 illustrates a simplified cross-sectional view of one embodiment of an oxide step having edges that lie on adjacent plugs in rows of the array.

FIG. 14 illustrates substrate 72 after etching and stripping photoresist layers 130a, 130b according to one embodiment of the present invention. In particular, the photoresist layers 130a, 130b (FIG. 13), and portions of exposed oxide layer 120 have been removed to expose oxide steps 120a, 120b centered on rows of plugs 62c, 62d, 62e of substrate 72.

Figure 15:
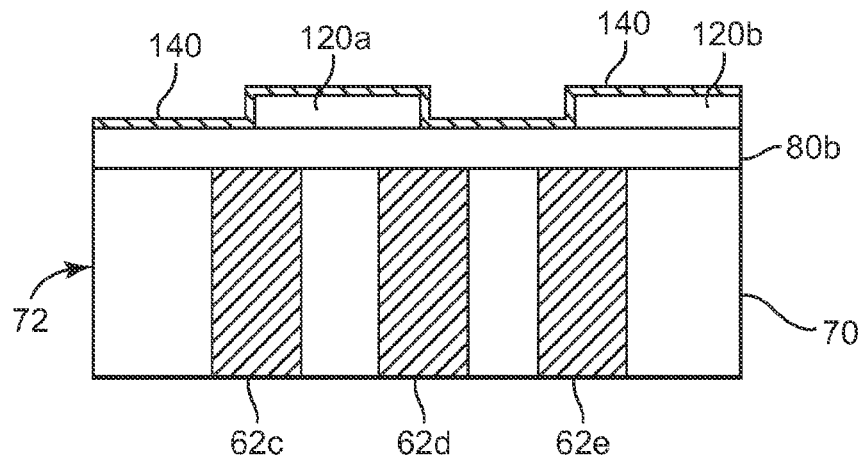
FIG. 15 illustrates a simplified cross-sectional view of one embodiment of a deposition of spacer material across rows of the arrays.

FIG. 15 illustrates spacer material 140 deposited to extend over an entirety of exposed substrate 72 according to one embodiment of the present invention. In one embodiment, spacer material 140 is deposited to have a thickness of less than approximately 60 nanometers. Preferably, spacer material 140 is deposited over exposed portions of substrate 72 and has a sub-lithographic thickness of less than 50 nanometers, more preferably the thickness of spacer material 140 is less than 30 nanometers, and most preferably the thickness of spacer material 140 is approximately 20 nanometers. In this regard, spacer material 140 can be deposited by CVD, ALD, MOCVD, PVD, or JVD processes (described above), or any other suitable deposition process. In one embodiment, spacer material 140 includes a chalcogenic phase change material layer that extends approximately uniformly over oxide steps 120a, 120b and silicon nitride portion 80b.

In the case where spacer material 140 is a phase change memory material, spacer material 140 is in one embodiment selected to be a chalcogenide that can comprise elements, and their alloys, as found in the periodic table of the elements in Column IV-VI. For example, in one embodiment spacer material 140 is an alloy of germanium, antimony, and tellurium having a chemical structure $Ge_2Sb_2Te_5$. In addition, spacer material 140 can include stratified layers of chalcogenic material characterized by a variation in electrical resistivity across the stratified layers. In this manner, the electrical properties of phase change layer 140 can be selectively controlled.

Figure 16:
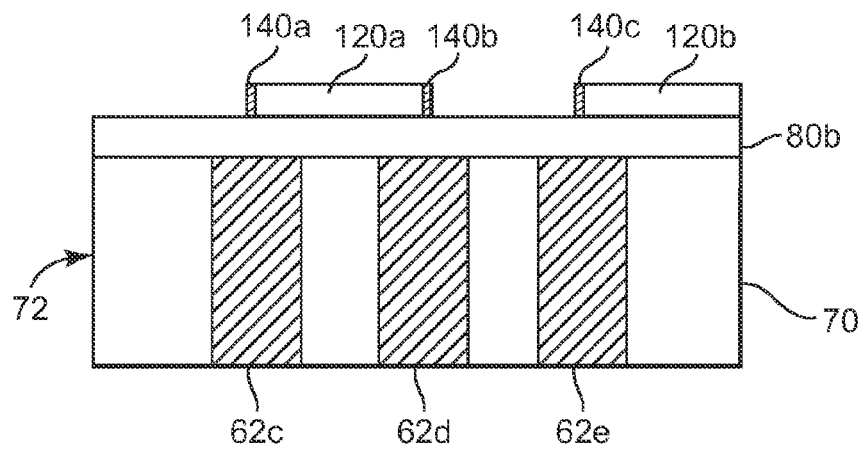
FIG. 16 illustrates a simplified cross-sectional view of one embodiment of spacers extending across columns and centered on rows of plugs.

FIG. 16 illustrates portions of spacer material 140 (FIG. 14) selectively removed by a reactive ion etch process according to one embodiment of the present invention. In particular, portions of spacer material 140 have been removed from the relative horizontal portions of substrate 72 such that spacers 140a, 140b, 140c remain exposed and disposed along edges of oxide steps 120a, 120b. As a point of reference, spacer material 140 can be deposited at sub-lithographic dimensions of approximately 20 nanometers in thickness.

Figure 17:
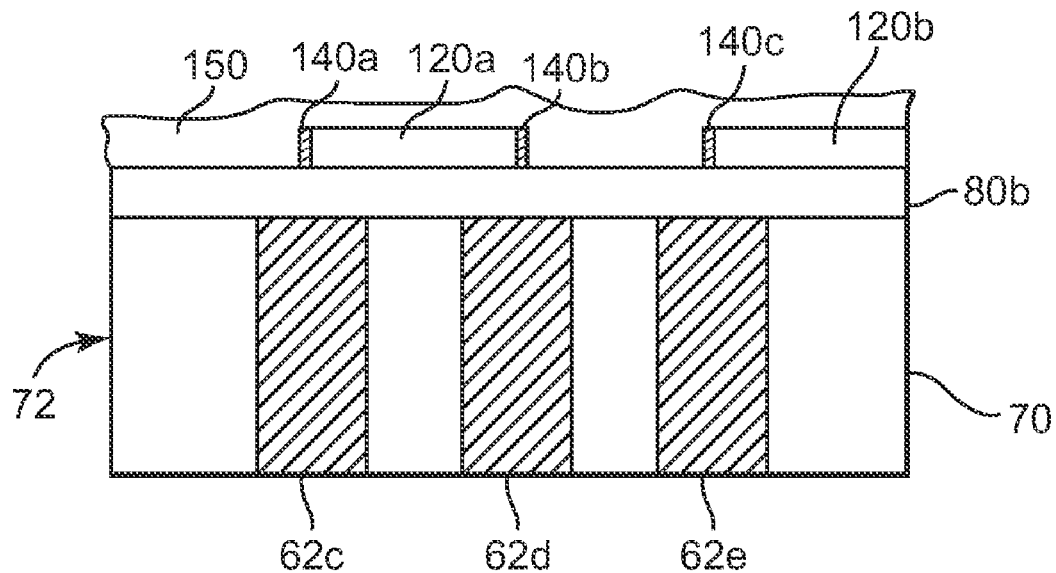
FIG. 17 illustrates a simplified cross-sectional view of one embodiment of a deposition of a dielectric over the spacers illustrated in FIG. 16.

FIG. 17 illustrates a bulk oxide layer 150 deposited to extend over exposed spacers 140a, 140b, and 140c according to one embodiment of the present invention. In one embodiment, bulk oxide layer 150 is deposited on the order of several hundred nanometers thick. As a point of reference, oxide layer 150 can be an oxide, a nitride, or other dielectric having suitable thermal etch and electrical characteristics.

Figure 18:
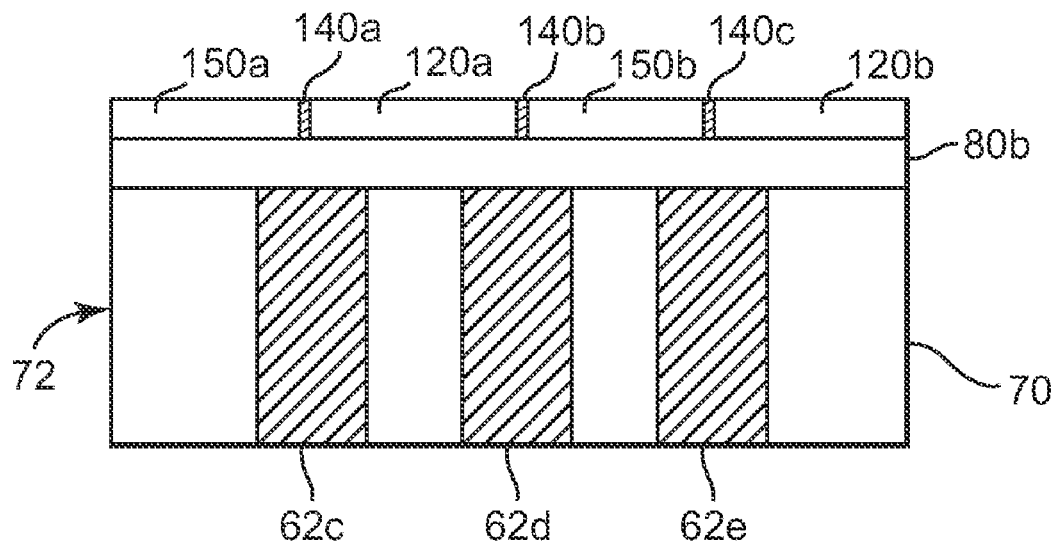
FIG. 18 illustrates a simplified cross-sectional view of one embodiment of spacers extending across columns of an array after a planarization step.

FIG. 18 illustrates substrate 72 after a chemical mechanical polishing of oxide layer 150 according to on embodiment of the present invention. In this regard, each of respective spacers 140a, 140b, and 140c is disposed between oxide portions. For example, spacer 140a is disposed between oxide portion 120a and oxide portion 150a, whereas spacer 140b is disposed between oxide portion 120a and oxide portion 150b. To this end, spacers 140a, 140b, 140c are spaced in separate rows to extend along columns of substrate 72.

Figure 19:
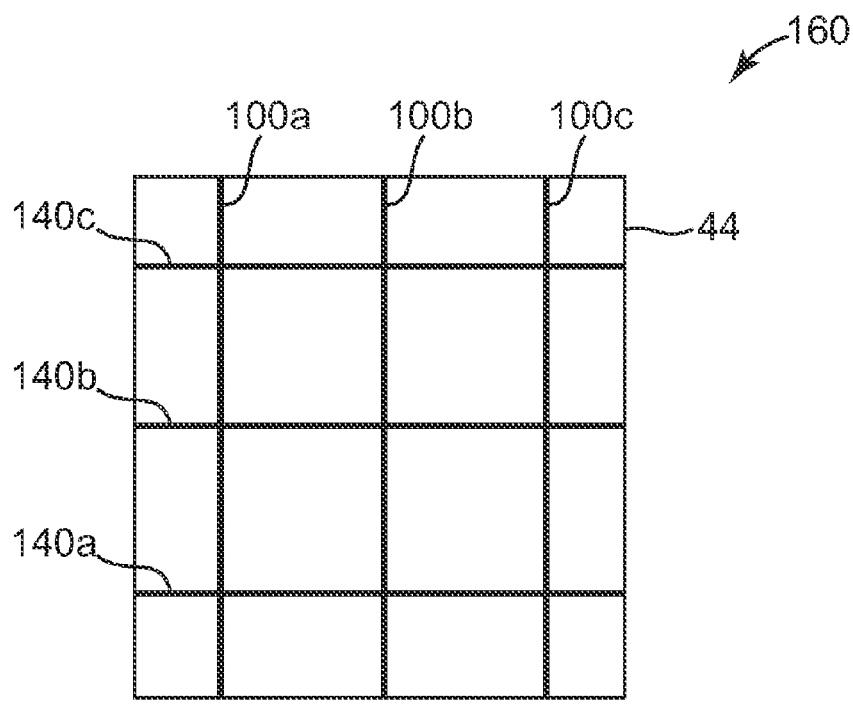
FIG. 19 is a top view of one embodiment of an array of non-parallel spacers.

FIG. 19 is a simplified top view of a portion of a memory device 160 defining an array of intersecting spacers 100a, 100b, 100c and spacers 140a, 140b, 140c. Spacers 100a, 100b, 100c are non-parallel to spacers 140a, 140b, 140c and extend across memory chip 44.

Figure 20:
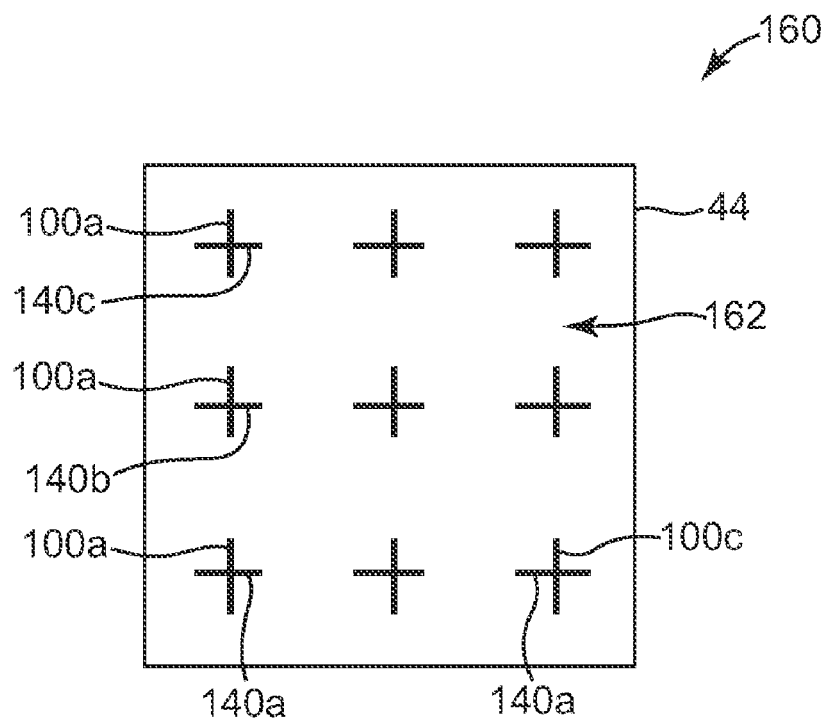
FIG. 20 is a top view of one embodiment of the array of non-parallel spacers separated into memory cells after an etch step.

FIG. 20 is a top view of a portion of the memory device 160 after a separation etch process where portions of spacers 100a, 100b, 100c and spacers 140a, 140b, 140c have been removed to provide a first thin film spacer 100a defining a sub-lithographic dimension and electrically coupled to a first electrode (plug 62a of FIG. 7), and a second thin film spacer 140a defining a sub-lithographic dimension and electrically coupled to a second electrode (see electrode 190 in FIG. 23) and deposited non-parallel to the first thin film spacer 100a, where a phase change memory cell is formed at a boundary of the first thin film spacer 100a in electrical contact with the second thin film spacer 140a.

As a point of reference, at least one of spacer material 100 and spacer material 140 comprises phase change memory material. In this regard, in one embodiment the phase change memory material comprises a chalcogenide, for example, a chalcogenide alloy comprising GeSbTe (GST), such as $Ge_2Sb_2Te$, or an alloy such as AgInSbTe. In one embodiment, the phase change memory material is a non-chalcogenide, or "chalcogenide-free." In one embodiment, for example, spacer 100a is a resistive "heater" spacer comprising titanium nitride and spacer 140a is a phase change memory spacer comprising $Ge_2Sb_2Te$, such that a phase change memory cell is provided at an intersection of spacer 100a and spacer 140a. In another embodiment, spacer 100a is a conductive spacer and spacer 140a is a phase change memory spacer. In another embodiment, spacer 100a is a phase change memory spacer and spacer 140a is a conductive spacer.

Figure 21:
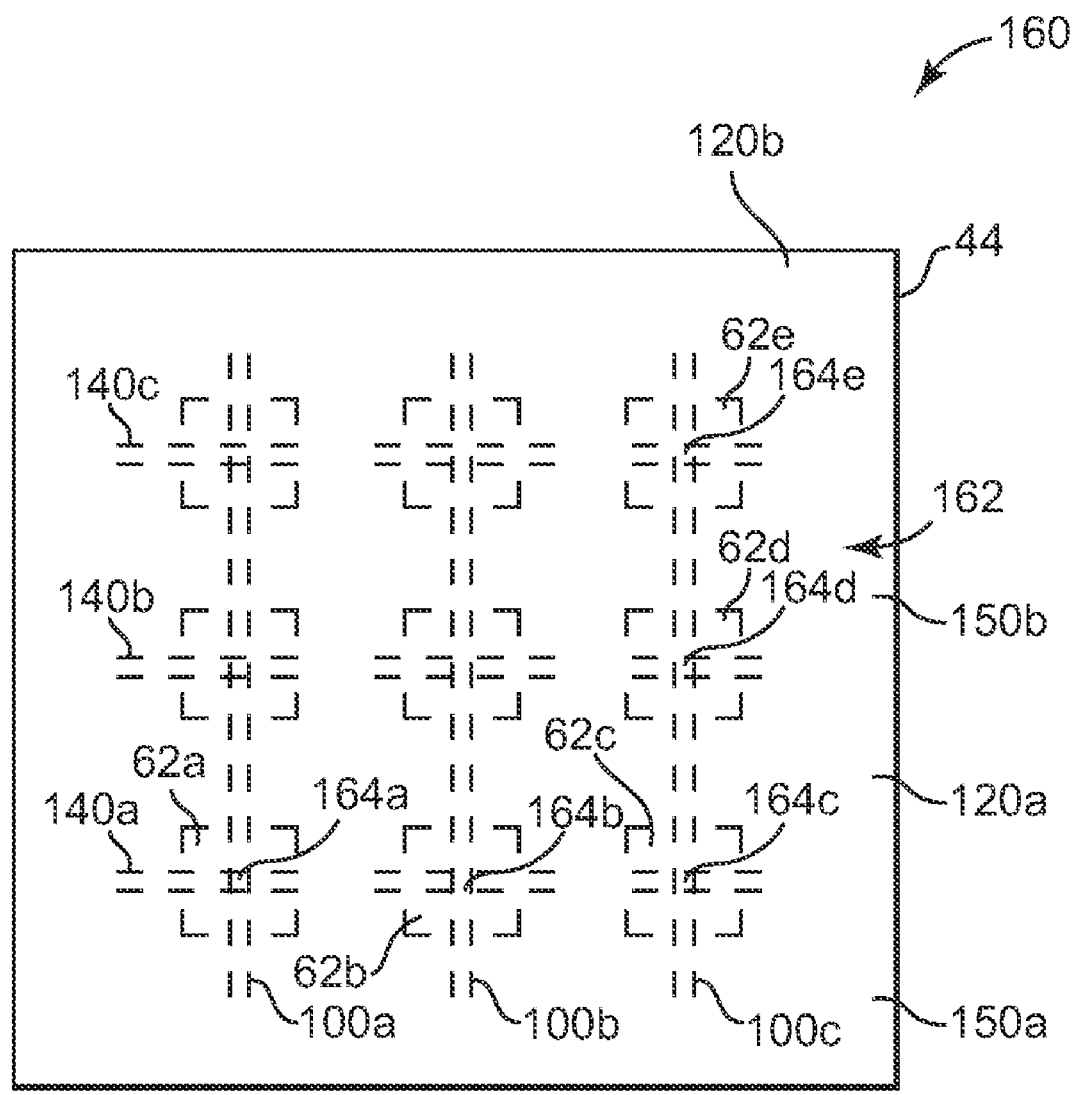
FIG. 21 illustrates a top schematic view of one embodiment of a memory device illustrating an array of phase change memory cells disposed on a chip.

FIG. 21 illustrates a simplified top dashed-line view of a portion of a memory device 160 highly similar to the view of FIG. 20. The portion of memory device 160 defines an array 162 of phase change memory cells 164 according to one embodiment of the present invention. In this regard, the memory device 160 is highly similar to the memory device 50 (FIG. 2) where the first spacers 58a, 58b, and 58c are analogous to spacers 100a, 100b, and 100c, and second spacers 60a, 60b, and 60c are analogous to spacers 140a, 140b, and 140c, respectively. With this in mind, a plurality of first spacers 100a, 100b, and 100c have been formed to extend in a first direction across array 162, and a plurality of second spacers 140a, 140b, and 140c have been formed to extend in a second direction across array 162 non-parallel to the first direction. First spacers 100a, 100b, 100c extend along separate columns of array 162 and intersect with second spacers 140a, 140b, 140c. A phase change memory cell 164 is formed at each intersection of each of the first spacers 100a, 100b, and 100c with each of the second non-parallel spacers 140a, 140b, 140c.

Specifically, for example, a phase change memory cell 164a is formed at the intersection of first spacer 100a with second spacer 140a. In a like manner, a phase change memory cell 164e is formed at the intersection of spacer 100c with spacer 140c. In this manner, a phase change memory cell 164 is formed at each intersection of each of the first spacers 100a, 100b, and 100c with each of the second non-parallel spacers 140a, 140b, 140c, such that first spacers and second spacers are non-parallel and contact across a sub-lithographic dimensional area.

Figure 22:
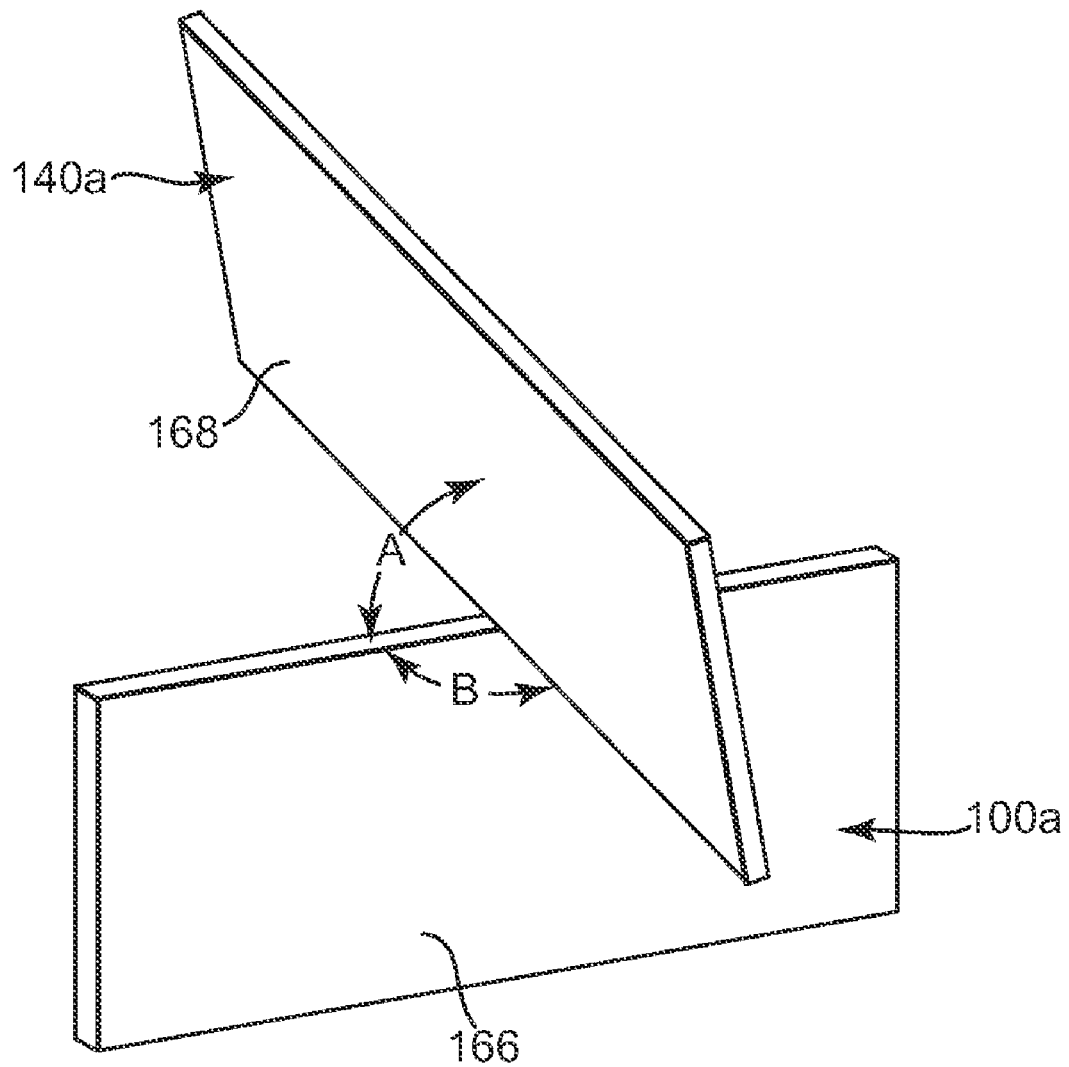
FIG. 22 illustrates a perspective view of one embodiment of a first spacer tilted relative to a second spacer and showing a sub-lithographic contact area.

FIG. 22 illustrates spacer 100a and spacer 140a isolated from their conductive electrodes and from array 162 for ease of illustration. During processing of the spacers 100a, 140a, for example, it is desired to minimize a contact area between spacer 100a and spacer 140a (having phase change memory material) such that temperature induced changes between logic states of memory cell 164a are rapid. With this in mind, it is generally desired that spacer 100a be orthogonal to spacer 140a, and further, that a plane of spacer 100a be perpendicular to a plane of spacer 140a. However, during processing, slight variations in the formation of oxide step 120a (FIG. 16), for example, can result in a plane of spacer 140a being "tilted" relative to a plane of spacer 100a, even though the respective longitudinal axes of spacer 100a and spacer 140 intersect at right angles. Conventional phase change memory cells that are tilted relative to one another are generally associated with inefficient current spreading and are said to be sensitive to sidewall angles. In contrast, embodiments of the present invention accommodate variations in spacer orientation such that the spacers are insensitive to variations in sidewall angles.

In this regard, spacer 100a defines a first sidewall 166 plane and spacer 140a defines a second sidewall 168 plane (hereafter sidewall 166 and sidewall 168). In one embodiment, spacer 140a is tilted relative to spacer 100a such that tilt angle A represents an orientation of spacer 140a relative to spacer 100a due to a variation in an orientation of oxide step 80a relative to oxide step 120a (See FIGS. 9 and 16). In this regard, tilt angle A represents a variation in an orientation of step 80a relative to oxide step 120a, otherwise referred to as a sidewall variation. Tilt angle A approximates 90 degrees, but in practice, can range between 70 degrees and 110 degrees.

Angle B is a crossing angle. In one embodiment, angle B is selected such that spacer 100a is non-parallel to spacer 140a. In this regard, angle B is between 1 degree and 179 degrees, preferably angle B is between 30 degrees and 150 degrees, and more preferably, angle B is approximately 90 degrees. In one embodiment, sidewall 168 is tilted at angle A relative to spacer 100a and sidewall 166 is oriented relative to sidewall 168 as represented by angle B.

For example, and with additional reference to FIG. 9 and FIG. 16, first spacers 100a and 100b are oriented relative to step 80a and second spacers 140a and 140b are oriented relative to oxide step 120a. In this regard, and in general, first spacers 100a, 100b, and 100c and second spacers 140a, 140b, 140c are oriented relative to each other, respectively, based upon an orientation of sidewalls of step 80a and oxide step 120a, such that first spacers and second spacers contact along a sub-lithographic dimension that is relatively insensitive to angles (or variations) formed by sidewalls of step 80a and step 120a.

In particular, in the case where step 80a is orthogonal to oxide step 120a such that the crossing angle B is 90 degrees, and where steps 80a and 120a are oriented at a tilt angle A of 90 degrees (i.e., not tilted), first spacers 100a, 100b and second spacers 140a, 140b contact across a sub-lithographic area of approximately 20 nanometers square. Moreover, in the case where spacer 140a is tilted at an angle A of approximately 78 degrees relative to spacer 100a, it has been determined that spacer 100a contacts spacer 140a across an area of approximately 19 nanometers square, indicating that an orientation of first spacers 100a, 100b, and 100c relative to second spacers 140a, 140b, 140c is insensitive to a variation in sidewall angles for steps 80a and 120a between approximately 70-110 degrees. In this manner, the contact area between respective ones of first spacers 100a, 100b, and 100c and second spacers 140a, 140b, 140c is a sub-lithographic boundary having a dimension of between approximately 18-22 nanometers square, even for relatively large variations in the relative tilt of steps 80a and 120a.

Figure 23:
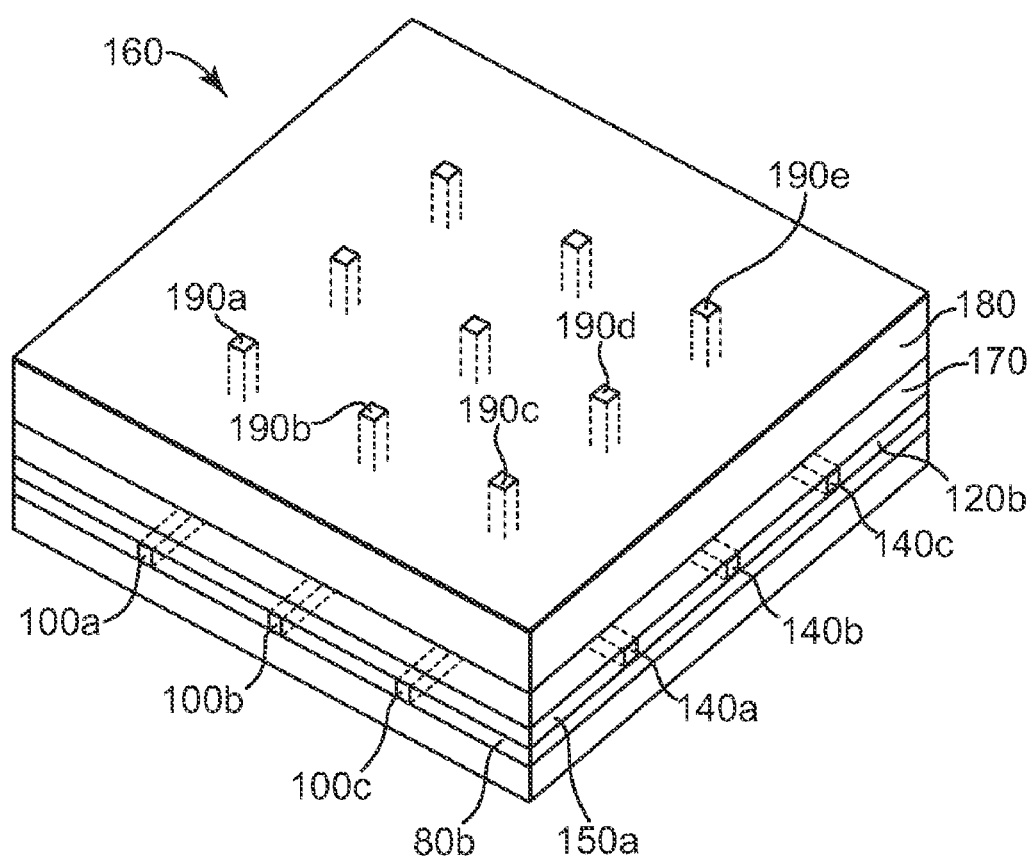
FIG. 23 illustrates a perspective view of one embodiment of the memory device illustrated in FIG. 21 after subsequent back end processing steps.

FIG. 23 illustrates a perspective view of memory device 160 after subsequent back end processing steps according to one embodiment of the present invention. In particular, memory device 160 illustrated in FIG. 21 is now illustrated in FIG. 23 to include a titanium nitride layer 170 disposed over second spacers 140a, 140b, 140c. In addition, after appropriate lithographic separation and etch separation steps, an insulating layer 180 is disposed over the titanium nitride layer 170. Second conductive electrodes 190a, 190b, 190c, 190d, and 190e extend through the titanium nitride layer 170 and the insulating layer 180 to electrically connect memory cells 154 (FIG. 18) of the memory device 160. In one embodiment, second conductive electrodes 190a, 190b, 190c, 190d, and 190e are tungsten plugs that extend through the titanium nitride layer 170 and the insulating layer 180 to electrically contact second spacers 140a, 140b, 140c of memory cells 154. However, one with skill in the memory wafer art will recognize that electrodes 190a-190e can comprise any suitable conductive electrode material, including, but not limited to tungsten and copper. In this regard, a via is defined photolithographically through at least insulating layer 180 and filled with conductive plug material, for example tungsten, to form electrodes 190a, 190b, 190c, 190d, and 190e. In one embodiment, conductive vias electrically connect between the memory cells 164 (this connection is not shown for ease of illustration).

Figure 24:
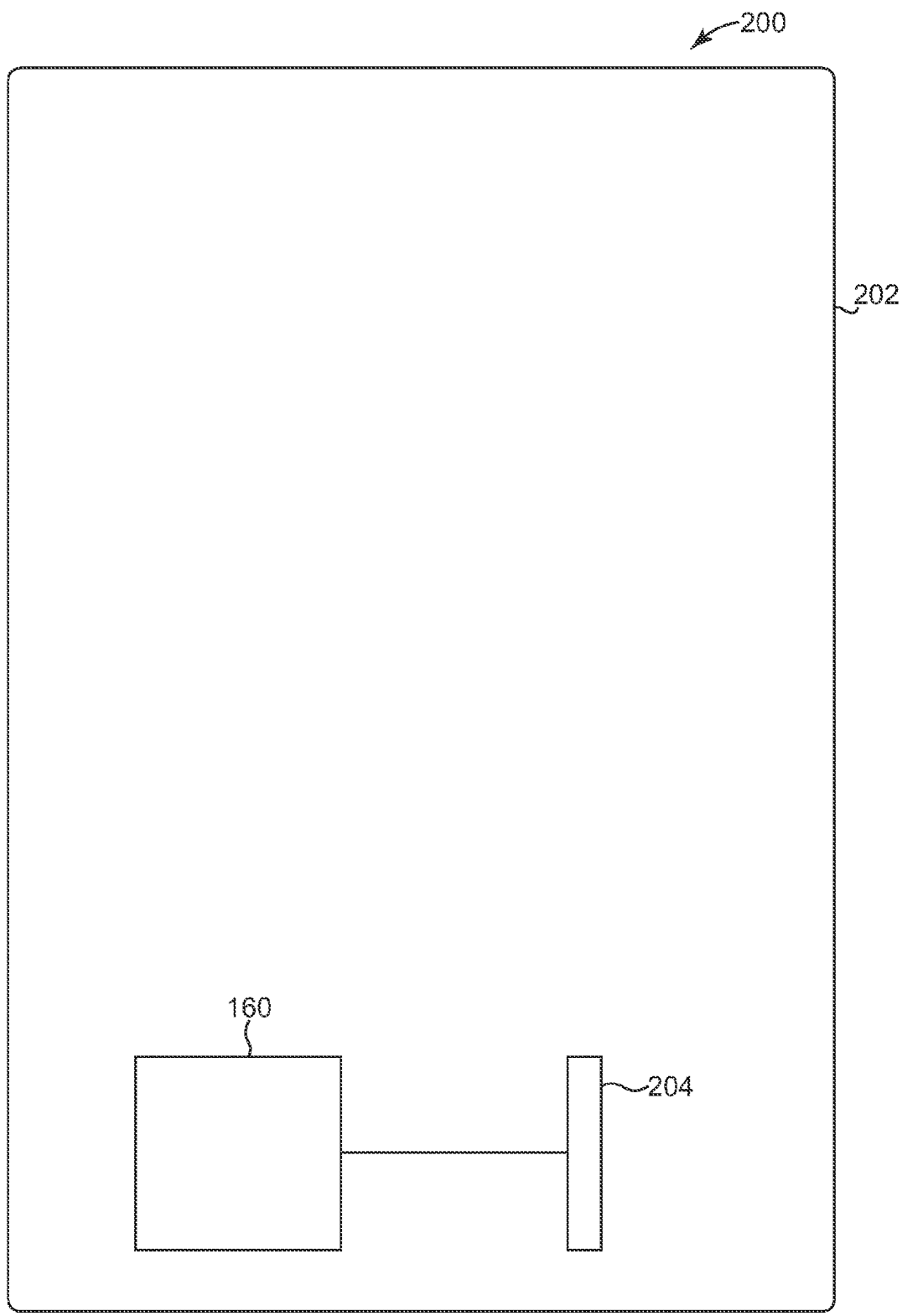
FIG. 24 illustrates an electronic system including an electronic device electrically connected to the memory device illustrated in FIG. 23.

FIG. 24 illustrates an electronic system 200 according to one embodiment of the present invention. Electronic system 200 includes an electronic device 202 electrically coupled to memory device 160 and a controller 204. In this regard, controller 204 is configured to address phase change memory cells 164 (FIG. 21) of memory device 160 to access and/or store information. Phase change memory cells 164 store retrievable data that can be accessed, changed, and stored by electronic system 200 through controller 204 that selectively changes a logic state of memory cells 164 by switching memory cells 164 between amorphous and crystalline atomic structures, as described above.

Embodiments of the present invention have been described that provide a phase change memory cell formed at a boundary where a first thin film spacer electrically contacts a non-parallel second thin film spacer across a sub-lithographic contact area such that temperature induced changes between logic states of the memory is rapid. In this regard, various embodiments have been described employing large area lithography (i.e., "big block" lithography) that is highly cost effective in a manufacturing setting. To this end, the big block lithography described herein has the potential to reduce mask costs.

In addition, the big block exposures described above permit variations in processing dimensions, and this broader process tolerance ultimately has little or no effect on a critical dimension (CD) of the device. That is to say, the patterning need not be exactly centered over the plugs, and as long as the CD variations are smaller than the overlay tolerances, there will be minimal effect on the CD of the device.

What is claimed is:

1. A method of forming a phase change memory cell comprising:
    forming a first thin film spacer defining a first sidewall and electrically coupled to a first electrode;
    forming a second thin film spacer defining a second sidewall, the second thin film spacer electrically coupled to a second electrode and formed non-parallel to the first thin film spacer, the second thin film spacer tilted relative to the first thin film spacer at an angle between 70-110 degrees; and
    means for electrically contacting the first thin film spacer to the second thin film spacer across a sub-lithographic contact area of between approximately 18-22 nanometers square.

2. A method of forming an array of phase change memory cells on a chip comprising:
    forming a plurality of columns of first spacers onto a substrate of the chip;
    forming a plurality of rows of second spacers to electrically contact the plurality of columns of first spacers, at least one of the columns of first spacers and rows of second spacers including phase change material; and
    etching the plurality of columns of first spacers and the plurality of rows of second spacers to form a plurality of phase change memory cells.

3. The method of claim 2, wherein forming a plurality of columns of first spacers comprises forming a plurality of columns of first spacers having a wall thickness of between approximately 18-22 nanometers.

4. The method of claim 2, wherein forming a plurality of rows of second spacers comprises forming a plurality of rows of second spacers having a wall thickness of between approximately 18-22 nanometers.

5. The method of claim 2, wherein the first spacers comprise titanium nitride.

6. The method of claim 2, wherein the second spacers comprise chalcogenic phase change material.

7. The method of claim 2, wherein forming a plurality of columns of first spacers includes:
    depositing an insulating layer over adjacent plugs of the chip;
    forming a mask over the insulating layer having mask edges extending along adjacent rows of plugs;
    removing unmasked portions of the insulating layer and the mask to define edges of the insulating layer extending along rows of plugs; and
    depositing a spacer material on at least the edges of the insulating layer extending along rows of plugs.

8. The method of claim 7, wherein removing unmasked portions of the insulating layer comprises reactive ion etching.

9. The method of claim 7, wherein etching the plurality of columns of first spacers and the plurality of rows of second spacers includes reactive ion etching a portion of the plurality of columns of first spacers and the plurality of rows of second spacers to define discrete spacers abutted to edges of the insulating layer.

10. The method of claim 2, wherein forming a plurality of rows of second spacers includes:
depositing an insulating layer over adjacent plugs of the chip;
forming a mask over the insulating layer having mask edges extending along adjacent columns of plugs;
removing unmasked portions of the insulating layer and the mask to define edges of the insulating layer extending along columns of plugs; and
depositing a spacer material on at least the edges of the insulating layer extending along columns of plugs.

11. The method of claim 10, wherein etching the plurality of columns of first spacers and the plurality of rows of second spacers includes reactive ion etching a portion of the plurality of columns of first spacers and the plurality of rows of second spacers to define discrete spacers abutted to edges of the insulating layer.

12. The method of claim 10, wherein depositing a spacer material comprises vapor depositing a chalcogenic phase change material.

13. The method of claim 10, wherein depositing a spacer material comprises vapor depositing a phase change material having a sub-lithographic dimension of between approximately 18-22 nanometers.

14. A method of forming a phase change memory cell on a chip comprising:
block exposure forming a first thin film spacer defining sub-lithographic dimensions onto a first electrode;
block exposure forming a second thin film spacer defining sub-lithographic dimensions, the second thin film spacer in electrical contact with the first thin film spacer and a second electrode; and
etching the first and second thin film spacers to isolate a phase change memory cell at an intersection of the first thin film spacer with the second thin film spacer.

15. The method of claim 14, wherein block exposure forming a second thin film spacer comprises fabricating a second thin film spacer of phase change material orthogonal to and in electrical contact with the first thin film spacer.

16. The method of claim 14, wherein block exposure forming a second thin film spacer comprises orienting the second thin film spacer at a tilt angle relative to the first thin film spacer.

17. The method of claim 16, wherein the second thin film spacer is tilted relative to the first thin film spacer at an angle of between approximately 70-110 degrees.

18. The method of claim 1, wherein the second thin film spacer electrically contacts the first thin film spacer across an area of between approximately 18-22 nanometers square.

* * * * *